(12) United States Patent
Park et al.

(10) Patent No.: US 10,636,467 B2
(45) Date of Patent: Apr. 28, 2020

(54) SOT-MRAM AND METHOD FOR WRITING DATA THEREOF

(71) Applicant: KOREA UNIVERSITY RESEARCH AND BUSINESS FOUNDATION, Seoul (KR)

(72) Inventors: Jongsun Park, Seoul (KR); Gyuseong Kang, Yongin-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/256,462

(22) Filed: Jan. 24, 2019

(65) Prior Publication Data

US 2019/0362765 A1 Nov. 28, 2019

(30) Foreign Application Priority Data

May 25, 2018 (KR) .................. 10-2018-0059451

(51) Int. Cl.
| | |
|---|---|
| G11C 11/16 | (2006.01) |
| G11C 8/08 | (2006.01) |
| G11C 7/10 | (2006.01) |
| H01L 27/22 | (2006.01) |

(Continued)

(52) U.S. Cl.
CPC ........ *G11C 11/1675* (2013.01); *G11C 7/1006* (2013.01); *G11C 8/08* (2013.01); *G11C 11/161* (2013.01); *G11C 11/1673* (2013.01); *G11C 11/1697* (2013.01); *G11C 11/39* (2013.01); *H01L 27/228* (2013.01); *H01L 43/08* (2013.01); *G11C 2211/5614* (2013.01)

(58) Field of Classification Search
CPC ............ G11C 11/1675; G11C 11/1697; G11C 11/161; G11C 11/1673; G11C 8/08; G11C 7/1006; G11C 11/39; G11C 2211/5614; H01L 27/228; H01L 43/08

See application file for complete search history.

(56) References Cited

U.S. PATENT DOCUMENTS

| 9,666,256 B1 | 5/2017 | Lai et al. |
| 9,768,229 B2 | 9/2017 | Braganca et al. |

(Continued)

FOREIGN PATENT DOCUMENTS

KR 10-2015-0112293 A 10/2015

OTHER PUBLICATIONS

Gyuseong Kang et al., Charge-Recycling based Redundant Write Prevention Technique for Low Power SOT-MRAM, IEEE, International Symposium on Circuits and Systems (ISCAS), May 2018, pp. 1-9 and 1-4.

(Continued)

*Primary Examiner* — Ajay Ojha
(74) *Attorney, Agent, or Firm* — Hauptman Ham, LLP

(57) ABSTRACT

A semiconductor device includes a line driving unit connected to a memory cell array, a switch unit including first and second output terminals electrically connected to the memory cell array through a plurality of bit lines and a plurality of source lines, and a power supply unit outputting a precharge voltage and a source voltage to the first and second output terminals. The power supply unit includes a negative voltage generation unit that charge-shares the precharge voltage to be charged with a first voltage and discharges the first voltage to one side to generate a negative voltage on the other side.

20 Claims, 13 Drawing Sheets

(51) Int. Cl.
  *H01L 43/08* (2006.01)
  *G11C 11/39* (2006.01)

(56) References Cited

U.S. PATENT DOCUMENTS

2004/0169548 A1   9/2004   Nonaka
2017/0365777 A1   12/2017  Mihajlovic et al.

OTHER PUBLICATIONS

Yeongkyo Seo et al., High Performance and Energy-Efficient On-Chip Cache Using Dual Port (1R/1W) Spin-Orbit Torque MRAM, IEEE Journal on Emerging and Selected Topics in Circuits and Systems, vol. 6. No. 3, Sep. 2016, pp. 293-304.
Korean Office Action dated Aug. 28, 2019, in connection with the Korean Patent Application No. 10-2018-0059451.

SOT-MRAM AND METHOD FOR WRITING DATA THEREOF

CROSS-REFERENCE TO RELATED APPLICATION

This U.S. non-provisional patent application claims priority under 35 U.S.C. § 119 of Korean Patent Application No. 10-2018-0059451, filed on May 25, 2018, the contents of which are hereby incorporated by reference in its entirety.

BACKGROUND

1. Field of Disclosure

Embodiments of the present disclosure relate to a semiconductor device and a method for writing data thereof, and more particularly, relate to an SOT-MRAM and a method for writing data thereof.

2. Description of the Related Art

In recent years, interest in a magnetic memory, particularly, a magnetic random access memory (MRAM), is increasing. As one kind of the MRAM, a spin transfer torque magnetic random access memory (STT-MRAM) is used. In more detail, the STT-MRAM expresses a magnitude of a resistance of a magnetic tunneling junction (MTJ) as data "1" and "0".

The STT-MRAM reads one of the data "1" and "0" based on a current induced by the resistance of the MTJ during a read operation. In particular, a path of a write current induced by the resistance of the MTJ during a write operation and a path of a read current induced by the resistance of the MTJ during the read operation are the same as each other, and substantially and simultaneously, the read operation and the write operation are performed.

However, since the path of the read current and the path of the write current are the same as each other, the STT-MRAM is required to vary the write current depending on the resistance of the MTJ during the write operation, and thus an operation time of the write operation increases. Consequently, the energy consumed in the write operation is varied depending on the resistance of the MTJ.

Accordingly, the present disclosure provides a spin orbit torque magnetoresistive random access memory (SOT-MRAM) and a method for writing data thereof, which are capable of preventing the energy consumed in the write operation from varying depending on the resistance of MTJ and capable of reducing the energy consumed in the write operation using the SOT-MRAM in which the path of the read current and the path of the write current are different from each other.

SUMMARY

The present disclosure provides a semiconductor device and a method for writing data thereof, which are capable of reducing an energy consumed in a write operation.

Embodiments of the inventive concept provide a semiconductor device including a line driving unit connected to a memory cell array, a switch unit including first and second output terminals electrically connected to the memory cell array through a plurality of bit lines and a plurality of source lines, and a power supply unit outputting a precharge voltage and a source voltage to the first and second output terminals. The power supply unit includes a negative voltage generation unit that charge-shares the precharge voltage to be charged with a first voltage and discharges the first voltage to one side to generate a negative voltage on the other side.

The switch unit switch-connects the first and second output terminals connected to the bit lines and the source lines to each other in response to input data.

The power supply unit outputs the negative voltage to the second output terminal when a drain voltage is output to the first output terminal.

The negative voltage generation unit includes a charge-share switch connected to the first output terminal, a charge capacitor connected to the first output terminal through the charge-share switch, first and second discharge transistors respectively connected to a first node located at the one side and the second output terminal, and an output transistor connected between a second node located at the other side and the second output terminal.

The charge-share switch charge-shares the precharge voltage output to the first output terminal with the charge capacitor in response to a first enable signal provided from the line driving unit.

The first discharge transistor discharges the first voltage to a common ground through the first node in response to a second enable signal provided from the line driving unit.

The second discharge transistor discharges the source voltage output to the second output terminal to the common ground in response to the second enable signal provided from the line driving unit.

The semiconductor device further includes a third discharge transistor connected to the second node, and the third discharge transistor discharges a negative voltage generated during a previous write operation to the common ground through the second node in response to an erase signal provided from the line driving unit.

The switch unit further includes a first application switch switch-connecting the first output terminal connected to one of the bit line and the source line in a pair of the bit line and the source line to the other of the bit line and the source line in the pair of the bit line and the source line in response to the input data and a second application switch switch-connecting the second output terminal to the one of the bit line and the source line.

The memory cell array includes a memory cell including a magnetic tunneling junction (MTJ) disposed between the pair of the bit line and the source line, and the memory cell includes a read word line and a write word line, which are respectively connected to gates of first and second transistors that connect the magnetic tunneling junction to the read and write word lines.

The line driving unit selects the read word line, senses a current flowing to the source line from the bit line through the magnetic tunneling junction, amplifies the sensed current, and reads storage data stored in the memory cell.

The line driving unit generates a write signal according to a difference between the storage data and the input data after selecting the write word line.

The negative voltage generation unit outputs the negative voltage to the second output terminal in response to the write signal.

Embodiments of the inventive concept provide a method for writing data of a semiconductor device, which includes a power supply unit including a negative voltage generation unit reusing a precharge voltage applied to a memory cell array during a read operation and a line driving unit, including allowing the negative voltage generation unit to charge-share a precharge voltage output to a first output terminal from the power supply unit and a charge capacitor to be charged with a first voltage based on the precharge voltage, allowing the negative voltage generation unit to discharge the first voltage through a first node located at one side of the charge capacitor, and allowing the negative voltage generation unit to output a negative voltage generated on a second node located at the other side of the charge capacitor to a second output terminal based on the discharge of the first voltage.

The charging includes allowing the negative voltage generation unit to connect the first output terminal to the charge capacitor in response to a first enable signal provided from a line driving unit.

The discharging includes allowing the negative voltage generation unit to connect the second node to a common ground in response to an erase signal provided from the line driving unit.

The discharging includes allowing the negative voltage generation unit to connect the first node to the common ground in response to a second enable signal provided from the line driving unit.

The discharging includes allowing the negative voltage generation unit to connect the second node to the second output terminal in response to the second enable signal.

The method further includes allowing first and second application switches of the semiconductor device, which are connected to the first and second output terminals, to switch-connect the first and second output terminals connected to a pair of a bit line and a source line among a plurality of bit lines and a plurality of source lines to each other in response to input data applied thereto.

The outputting includes allowing the line driving unit to generate a third enable signal based on a difference between storage data stored in a memory cell and input data that are to be written.

The outputting includes allowing the line driving unit to generate a write signal based on whether the third enable signal is generated when a write word line connected to the memory cell is selected.

The outputting includes allowing the negative voltage generation unit to connect the second node to the second output terminal in response to the write signal provided from the line driving unit.

According to the SOT-MRAM and the method for writing the data thereof, the energy consumed during the write operation may be reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
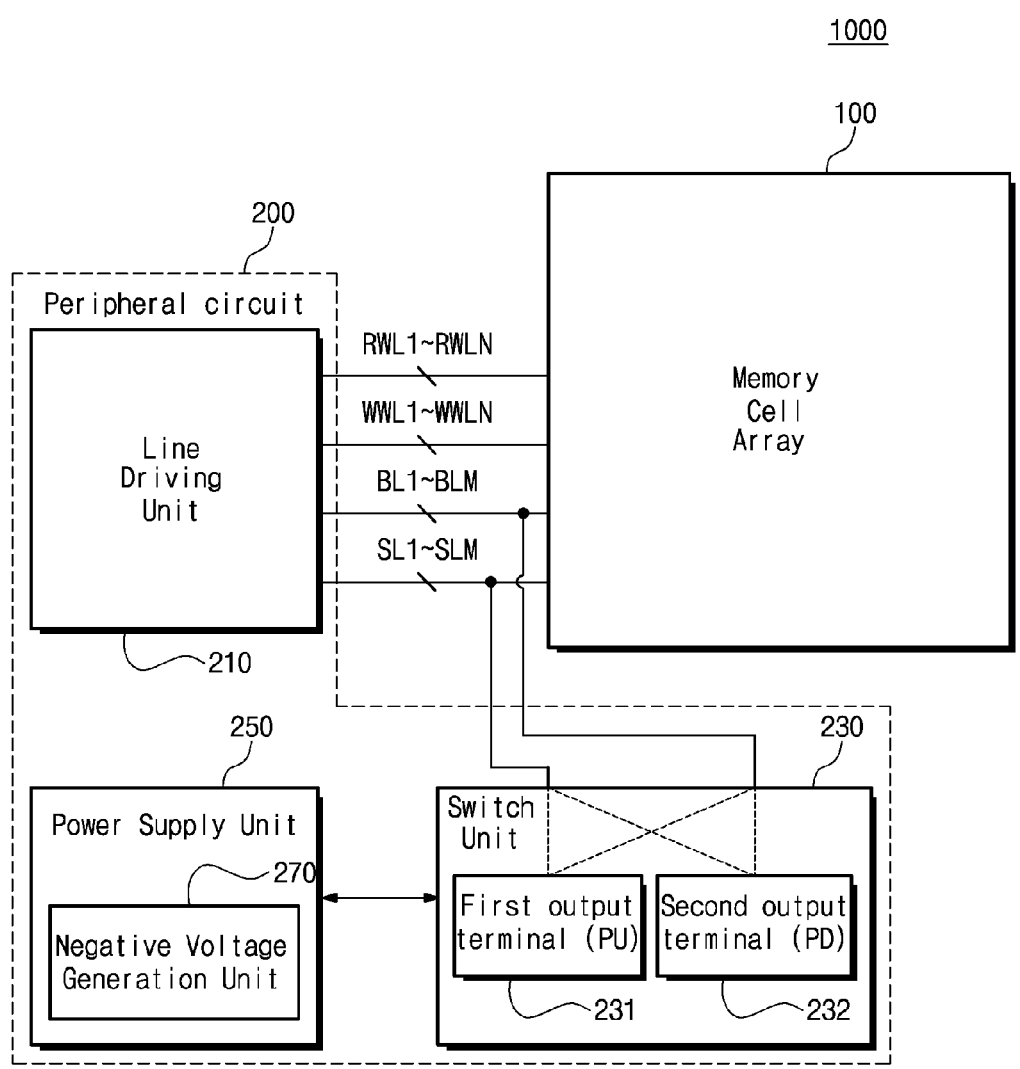
FIG. 1 is a block diagram showing a semiconductor device according to an exemplary embodiment of the present disclosure.

As specific structural or functional descriptions for the embodiments according to the concept of the invention disclosed herein are merely exemplified for purposes of describing the embodiments according to the concept of the invention, the embodiments according to the concept of the invention may be embodied in various forms but are not limited to the embodiments described herein.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be explained in detail with reference to the accompanying drawings.

Figure 2:
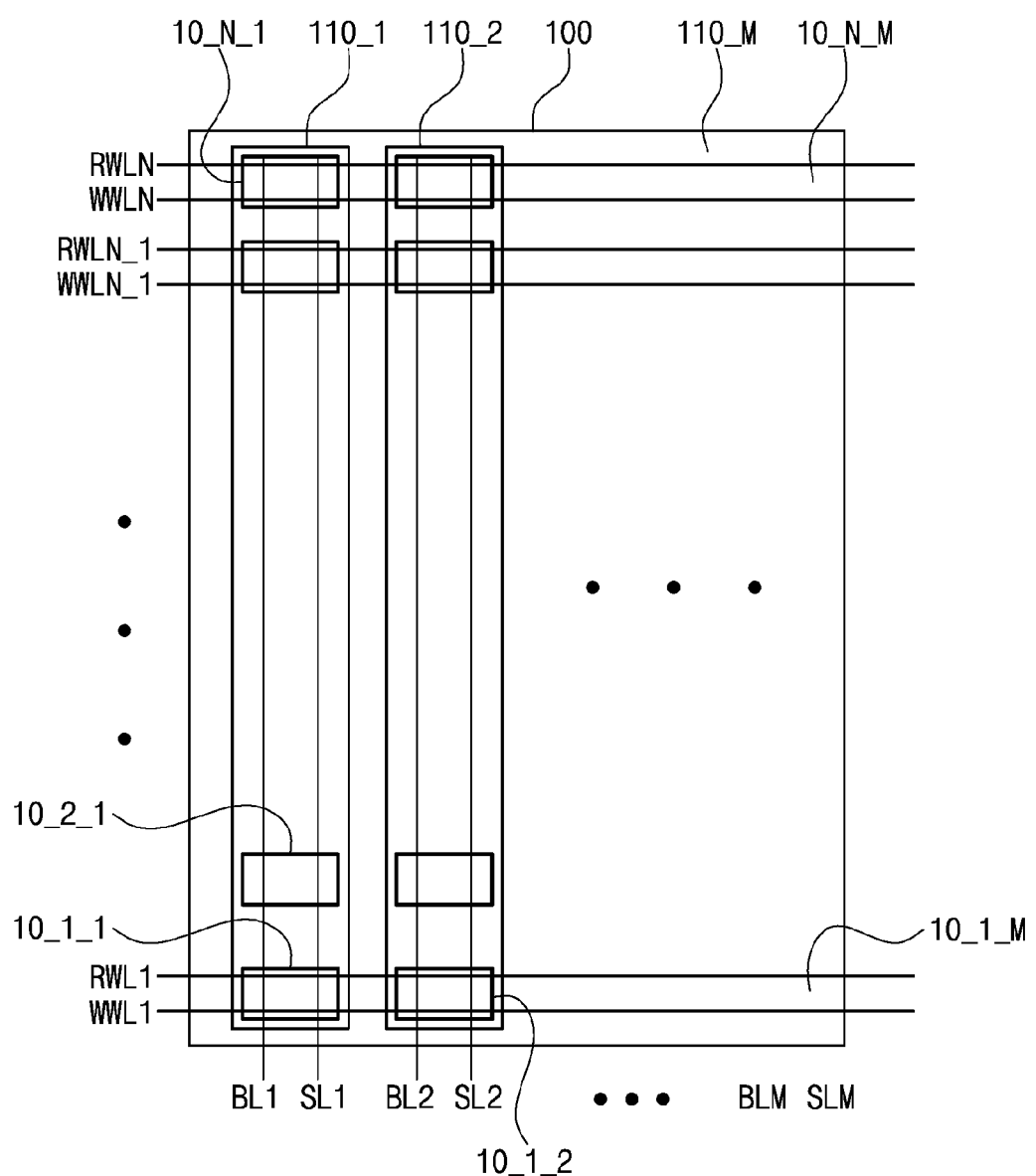
FIG. 2 is a plan view showing a memory cell array of FIG. 1.
Figure 3:
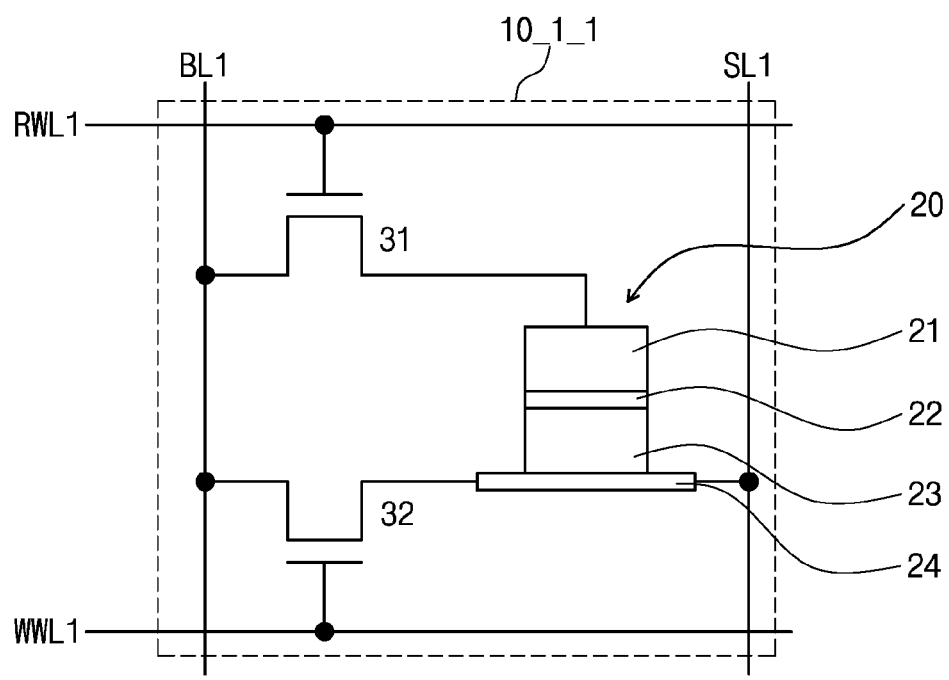
FIG. 3 is a circuit diagram showing one memory cell of FIG. 2.

FIG. 1 is a block diagram showing a portion of a semiconductor device 1000 according to an exemplary embodiment of the present disclosure, FIG. 2 is a plan view showing a memory cell array 100 of FIG. 1, and FIG. 3 is a circuit diagram showing a memory cell 10_1_1 of FIG. 2.

Referring to FIGS. 1 to 3, the semiconductor device 1000 includes the memory cell array 100 and a peripheral circuit 200.

The memory cell array 100 includes a plurality of sub-arrays 110_1 to 110_M electrically connected to a plurality of bit lines BL1 to BLM, a plurality of source lines SL1 to SLM, a plurality of read word lines RWL1 to RWLN, and a plurality of write word lines WWL1 to WWLN.

In the present exemplary embodiment, the sub-arrays 110_1 to 110_M may be electrically connected to the read word lines RWL1 to RWLN and the write word lines WWL1 to WWLN. In addition, each of the sub-arrays 110_1 to 110_M may be electrically connected to a pair of a corresponding bit line among the bit lines BL1 to BLM and a corresponding source line among the source lines SL1 to SLM. For instance, a first sub-array 110_1 may be electrically connected to the read word lines RWL1 to RWLN and the write word lines WWL1 to WWLN and, substantially and simultaneously, may be electrically connected to a pair of a first bit line BL1 and a first source line SL1.

In addition, the sub-arrays 110_1 to 110_M may include first to M-th memory cells 10_1_1 to 10_N_M. In more detail, each of the sub-arrays 110_1 to 110_M may include corresponding memory cells 10_1_1 to 10_N_1, 10_1_2 to 10_N_2 . . . , and 10_1_M to 10_N_M electrically connected to the pair of the bit line and the source line among a plurality of memory cells 10_1_1 to 10_N_M. For instance, the first sub-array 110_1 may include a plurality of first memory cells 10_1_1 to 10_N_1 electrically connected to the first bit line BL1 and the first source line SL1, and a second sub-array 110_2 may include a plurality of second memory cells 10_1_2 to 10_N_2 electrically connected to a second bit line BL2 and a second source line SL2.

That is, the memory cell array 100 may include the first memory cells to M-th memory cells 10_1_1 to 10_N_M.

Hereinafter, since the first memory cells to M-th memory cells 10_1_1 to 10_N_M have the same function and operation, for the convenience of explanation, one memory cell 10_1_1 will be described in detail.

The memory cell 10_1_1 may include a magnetic tunneling junction (hereinafter, referred to as "MTJ") 20 and first and second transistors 31 and 32, which are formed between the first bit line BL1 and the first source line SL1.

The MTJ 20 may include a reference layer 21, a nonmagnetic spacer layer 22, a data storage layer 23, and a metal layer 24.

In more detail, the reference layer 21 may include a ferromagnetic layer and may be called a pinned layer, and a magnetization direction of the reference layer 21 may be pinned in one direction. For example, the reference layer 21 may include Co, Fe, Ni, or an alloy thereof or a material similar thereto. In addition, the nonmagnetic spacer layer 22 may have a thickness sufficient to allow tunneling of electrons. For example, the nonmagnetic spacer layer 22 may include $Al_2O_3$, MgO, AlN, $Ta_2O_5$, $SiO_2$, $HfO_2$, $ZrO_2$, $MgF_2$, $CaF_2$ or a material similar thereto. In addition, the data storage layer 23 may be the ferromagnetic layer similar to the reference layer 21. In this case, different from the reference layer 21, a magnetization direction of the data storage layer 23 may be switched to one or another direction. Then, the metal layer 24 in which a strong spin orbit torque occurs may switch the magnetization direction of the data storage layer 23 based on a magnitude of a current induced along a surface. As an example, the metal layer 24 may include a heavy metal or a material doped with the heavy metal.

The first transistor 31 may be connected to the first read word line RWL1 through a gate thereof, connected to the first bit line BL1 through a drain thereof, and connected to the reference layer 21 of the MTJ 20 through a source thereof. In addition, the second transistor 32 may be connected to the first write word line WWL1 through a gate thereof, connected to the first bit line BL1 through a drain thereof, and connected to the metal layer 24 of the MTJ 20 through a source thereof. That is, one MTJ 20 may be connected to the pair of the first bit line BL1 and the first source line SL1 and the pair of the read and write word lines RWL1 and WWL1 through the first and second transistors 31 and 32.

The peripheral circuit 200 may include a line driving unit 210, a switch unit 230, and a power supply unit 250.

The line driving unit 210 may be connected to the memory cell array 100 through the bit lines BL1 to BLM, the source lines SL1 to SLM, and the read and write word lines RWL1 to RWLN and WWL1 to WWLN. That is, the line driving unit 210 may be individually connected to each of the first memory cells to M-th memory cells 10_1_1 to 10_N_M through the bit lines BL1 to BLM, the source lines SL1 to SLM, and the read and write word lines RWL1 to RWLN and WWL1 to WWLN.

In addition, the line driving unit 210 may read storage data D0 stored in one memory cell, for instance, the memory cell 10_1_1, among the first memory cells to M-th memory cells 10_1_1 to 10_N_M.

In this case, the line driving unit 210 may select one read word line, for example, RWL1, connected to a corresponding memory cell, for example, 10_1_1, among the read word lines RWL1 to RWLN. Then, the line driving unit 210 may detect a current flowing between one bit line, for example, BL1, and one source line, for example, SL1, which are connected to the one memory cell, for example, 10_1_1, and may amplify the detected current. In addition, the line driving unit 210 may compare the detected and amplified current with a reference current to read the storage data D0.

That is, in a case where the first read word line RWL1 is selected, the line driving unit 210 may read the magnetization direction of the data storage layer 23 of the one memory cell, for example, 10_1_1, based on the detected and amplified current. Here, the magnetization direction may be a resistance against the current and, substantially and simultaneously, may be the storage data D0.

In more detail, the line driving unit 210 may generate a precharge signal PCHGEN to read the storage data D0 stored in the one memory cell, for example, 10_1_1. The precharge signal PCHGEN may be a control signal transmitted to the power supply unit 250 by the line driving unit 210 to output a precharge voltage VPRE and a source voltage VSS to first and second output terminals 231 and 232.

Then, the line driving unit 210 may generate a first enable signal CSEN after transmitting the precharge signal PCHGEN. The first enable signal CSEN may be a control signal transmitted to the power supply unit 250 to charge-share the precharge voltage VPRE output to the first output terminal 231.

In this case, the line driving unit 210 may select the first read word line RWL1 connected to one memory cell, e.g., 10_1_1, among the first memory cells to M-th memory cells 10_1_1 to 10_N_M. After the first read word line RWL1 is selected, the line driving unit 210 may generate a second enable signal NGEN. The second enable signal NGEN may be a control signal transmitted to the power supply unit 250 by the line driving unit 210 to discharge the charged voltage charge-shared by the first enable signal CSEN.

In addition, the line driving unit 210 may select the first write word line WWL1 connected to a memory cell, e.g., 10_1_1, among the write word lines WWL1 to WWLN. In more detail, the line driving unit 210 may generate a third enable signal WEN based on a difference between the read-out storage data D0 and input data D1 to write the input data D1 in the one memory cell, e.g., 10_1_1, which is read. The third enable signal WEN may be a control signal transmitted to the power supply unit 250 by the line driving unit 210 to output a drain voltage VDD to the first output terminal 231.

That is, the line driving unit 210 may generate the third enable signal WEN and transmit the third enable signal WEN to the power supply unit 250 to switch the magnetization direction of the data storage layer 23 in the one memory cell, e.g., 10_1_1, which is read. The switched magnetization direction may be a resistance against the current and, substantially simultaneously, may be the input data D1.

After that, the line driving unit 210 may select the first write word line WWL1 connected to one memory cell, e.g., 10_1_1, among the write word lines WWL1 to WWLN. In this case, the line driving unit 210 may generate a write signal WSTART when the third enable signal WEN is generated and the first write word line WWL1 is selected. The write signal WSTART may be a control signal transmitted to the power supply unit 250 by the line driving unit 210 to output a negative voltage VBB to the second output terminal 232.

In the present disclosure, for the convenience of explanation, the line driving unit 210 is shown as one component, however, it should not be limited thereto or thereby. For example, the line driving unit 210 may include a plurality of row selection circuits for selecting the read and write word lines RWL1 to RWLN and WWL1 to WWLN, a plurality of column selection circuits for selecting the bit lines BL1 to BLM and the source lines SL1 to SLM, a read-write circuit for reading and writing the storage data D0 from and into one memory cell 10_1_1, and a plurality of control circuits including control logics for controlling a power supply according to its functions. These circuits may independently perform functions of the line driving unit 210.

Then, the switch unit 230 may include the first output terminal 231 and the second output terminal 232. That is, the switch unit 230 may be connected to the memory cell array 100 via the first and second output terminals 231 and 232 electrically connected to the bit lines BL1 to BLM and the source lines SL1 to SLM.

In more detail, the first and second output terminals 231 and 232 may apply the precharge voltage VPRE and the source voltage VSS to the memory cell array 100 via the bit lines BL1 to BLM and the source lines SL1 to SLM.

For example, the first and second output terminals 231 and 232 may receive the precharge voltage VPRE and the source voltage VSS from the power supply unit 250 during the read operation. Then, the first output terminal 231 may apply the precharge voltage VPRE to the memory cell array 100 via the bit lines BL1 to BLM. The second output terminal 232 may apply the source voltage VSS to the memory cell array 100 via the source lines SL1 to SLM.

In addition, the first and second output terminals 231 and 232 may apply the drain voltage VDD and the negative voltage VBB to the memory cell array 100 via the bit lines BL1 to BLM and the source lines SL1 to SLM. The drain voltage VDD and the negative voltage VBB may be voltages output from the power supply unit 250, which is described below, during the write operation.

For example, the first and second output terminals 231 and 232 may receive the drain voltage VDD and the negative voltage VBB from the power supply unit 250 during the write operation. Then, the first output terminal 231 may apply the drain voltage VDD to the memory cell array 100 via the bit lines BL1 to BLM. The second output terminal 232 may apply the negative voltage VBB to the memory cell array 100 via the source lines SL1 to SLM.

The switch unit 230 according to the exemplary embodiment may switch-connect the pair of the bit line and the source line, e.g., BL1 and SL1, among the bit lines BL1 to BLM and the source lines SL1 to SLM and the first and second output terminals 231 and 232 to each other in response to the input data D1. For instance, when the input data D1 that is to be input to the memory cell 10_1_1 is '0', the switch unit 230 may switch the first output terminal 231 connected to the corresponding bit line, e.g., BL1, of the memory cell 10_1_1 to the second output terminals 232. In addition, the switch unit 230 may switch the second output terminal 232 connected to the corresponding source line SL1 to the first output terminal 231.

That is, the switch unit 230 may switch the first output terminal 231 connected to one bit line, e.g., BL1, among the bit lines BL1 to BLM to the second output terminal 232 in response to the input data D1. Simultaneously, the switch unit 230 may switch the second output terminal 232 connected to one source line SL1 among the source lines SL1 to SLM to the first output terminal 231.

According to the exemplary embodiment, each of the first and second output terminals 231 and 232 may be provided in plural number depending on the number of the sub-arrays 110_1 to 110_M. Therefore, the plural first and second output terminals 231 and 232 may be respectively connected to the pair of the bit line and the source line, which is connected to each of the sub-arrays 110_1 to 110_M. For instance, a first first-and-second output terminal may be connected to the first sub-array 110_1 via the pair of first bit line BL1 and the first source line SL1, and a second first-and-second output terminal may be connected to the second sub-array 110_2 via the pair of the second bit line BL2 and the second source line SL2.

In the present disclosure, the term "apply" or "output" is used in the same sense to mean "the supply of a voltage". When the voltage is supplied to the memory cell array 100, the term "apply" is used, and when the voltage is supplied to the switch unit 230, the term "output" is used.

Then, the power supply unit 250 may be a power circuit for outputting the precharge voltage VPRE and the source voltage VSS to the first and second output terminals 231 and 232 during the read operation.

The power supply unit 250 according to the exemplary embodiment may include a negative voltage generation unit 270.

In more detail, the negative voltage generation unit 270 may charge-share the precharge voltage VPRE output to the first output terminal 231 to charge a first voltage VCS and may discharge the first voltage VCS to one side to generate the negative voltage VBB in the other side.

In addition, the power supply unit 250 may output the negative voltage VBB generated by the negative voltage generation unit 270 to the second output terminal 232 when outputting the drain voltage VDD to the first output terminal 231 during the write operation.

In more detail, during the write operation, the power supply unit 250 may change the precharge voltage VPRE to the drain voltage VDD and may output the changed drain voltage VDD to the first output terminal 231. In this case, the power supply unit 250 may output the negative voltage VBB generated by the negative voltage generation unit 270 to the second output terminal 232 based on the difference between the input data D1 and the storage data D0. In this case, the drain voltage VDD may have a voltage level higher than that of the precharge voltage VPRE, the voltage level of the precharge voltage VPRE may be higher than that of the source voltage VSS, and the voltage level of the source voltage VSS may be higher than that of the negative voltage VBB.

In the exemplary embodiment of the present disclosure, in a case where the input data D1 is written into the memory cell array 100, first, the semiconductor device 1000 may apply the precharge voltage VPRE and the source voltage VSS to the memory cell array 100. Then, the semiconductor device 1000 may read the storage data D0 stored in one memory cell, e.g., 10_1_1, of the memory cell array 100 through the line driving unit 210. In addition, the semiconductor device 1000 may apply the drain voltage VDD and the negative voltage VBB through the first and second output terminals 231 and 232 connected to the bit lines BL1 to BLM and the source lines SL1 to SLM when the difference exists between the storage data D0 and the input data D1. The semiconductor device 1000 may write the input data D1 into one memory cell, e.g., 10_1_1, through the line driving unit 210. That is, the semiconductor device 1000 may reuse the precharge voltage VPRE applied during the read operation as the negative voltage VBB applied during the write operation. Accordingly, the semiconductor device 1000 may have the effect of reducing the energy consumed when writing the input data D1 more than that in a conventional semiconductor device.

Hereinafter, the negative voltage generation unit 270 that generates the negative voltage VBB will be described in detail with reference to FIG. 4.

Figure 4:
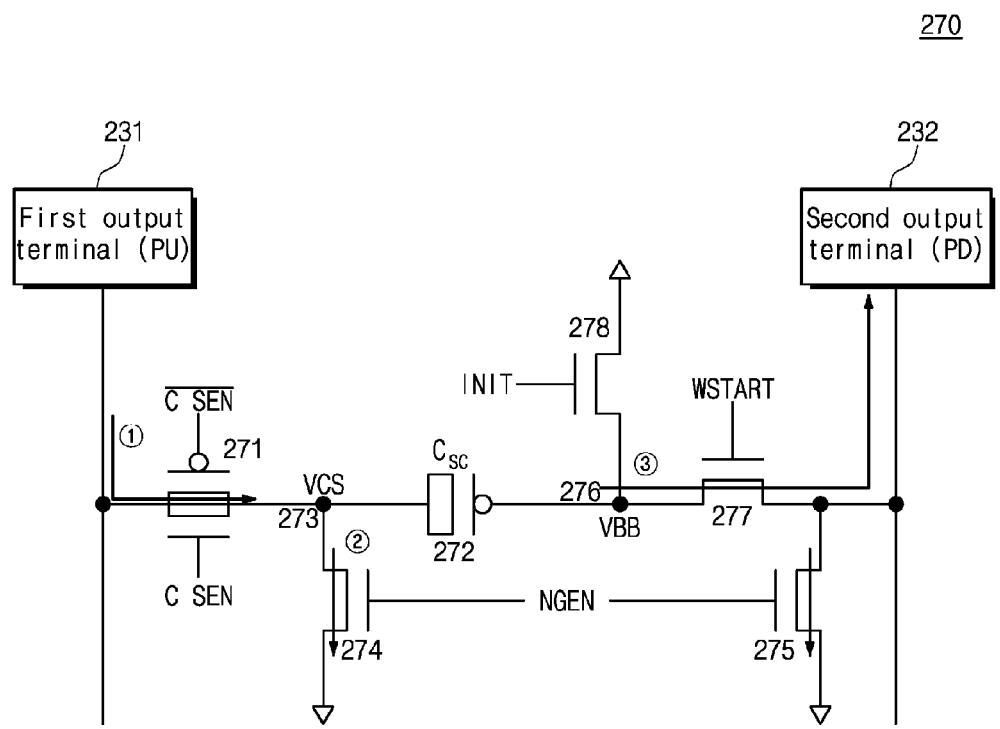
FIG. 4 is a circuit diagram showing a negative voltage generation unit of FIG. 1.

FIG. 4 is a circuit diagram showing the negative voltage generation unit 270 of FIG. 1.

Referring to FIGS. 1 to 4, the negative voltage generation unit 270 may include a charge capacitor 272, a charge-share switch 271, first and second discharge transistors 274 and 275, an output transistor 277, and a third discharge transistor 278.

The charge-share switch 271 is connected to the first output terminal 231, connects the first output terminal 231 and the charge capacitor 272 in response to the first enable signal CSEN provided from the line driving unit 210, and transmits the precharge voltage VPRE output to the first output terminal 231 to the charge capacitor 272. That is, the charge-share switch 271 may be implemented in a pair of switches, when one of which is switched on in response to the first enable signal CSEN having a negative (−) or positive (+) property, the other is switched off.

Then, when the charge capacitor 272 is electrically connected to the first output terminal 231 through the charge-share switch 271, the charge capacitor 272 may charge-share the precharge voltage VPRE output to the first output terminal 231 and may be charged with the first voltage VCS depending on capacitance. In this case, the charge capacitor 272 may be a capacitor charged with the first voltage VSC depending on the capacitance with respect to the precharge voltage VPRE or may be a circuit implemented by a plurality of capacitors connected to each other in parallel.

The first discharge transistor 274 may be connected to a first node 273 located at one side of the charge capacitor 272 and may be connected between the first node 273 and a common ground. In more detail, the first discharge transistor 274 may discharge the first voltage VCS charged in the charge capacitor 272 to the common ground through the first node 273 in response to the second enable signal NGEN provided from the line driving unit 210. That is, the first discharge transistor 274 may be a transistor that receives the second enable signal NGEN as a signal for its gate and discharges the first voltage VSC applied to its drain to the common ground of its source through the first node 273.

As described above, since the first voltage VCS charged in the charge capacitor 272 is discharged to the common ground from the first node 273 located at the one side of the charge capacitor 272 through the first discharge transistor 274, the charge capacitor 272 may generate the negative voltage VBB on a second node 276 located at the other side of the charge capacitor 272.

Then, the second discharge transistor 275 may be connected to the second output terminal 232 and may be connected between the second output terminal 232 and the common ground. In more detail, the second discharge transistor 275 may discharge the source voltage VSS output to the second output terminal 232 to the common ground in response to the second enable signal NGEN. That is, the second discharge transistor 275 may be a transistor that receives the second enable signal NGEN as a signal for its gate and discharges the source voltage VSS applied to its drain to the common ground of its source.

The output transistor 277 may be connected between the second output terminal 232 and the second node 276. In addition, the output transistor 277 may output the negative voltage VBB generated on the second node 276 to the second output terminal 232 in response to the write signal WSTART provided from the line driving unit 210. That is, the output transistor 277 may be a transistor that receives the write signal WSTART as a signal for its gate and discharges the negative voltage VBB applied to its drain to the second output terminal 232 of its source.

According to the exemplary embodiment, the negative voltage generation unit 270 may further include the third discharge transistor 278. The third discharge transistor 278 may discharge the negative voltage VBB generated during a previous write operation to the common ground through the second node 278 in response to an erase signal INIT provided from the line driving unit 210. That is, the output transistor 278 may be a transistor that receives the erase signal INIT as a signal for its gate and outputs the negative voltage VBB generated during the previous write operation in its drain to the common ground of its source.

The negative voltage generation unit 270 according to the exemplary embodiment of the present disclosure may charge-share the precharge voltage VPRE applied to the first output terminal 231 through the charge-share switch 271 that responds to the first enable signal CSEN. In this case, the negative voltage generation unit 270 may be charged with the first voltage VCS through the charge capacitor 272 depending on the capacitance. The negative voltage generation unit 270 discharges the first voltage VCS charged in the charge capacitor 272 through the first discharge transistor 274 from the first node 273 located at the one side, and thus the negative voltage VBB may be generated at the second node 276 located at the other side. In addition, the negative voltage generation unit 270 may output the negative voltage VBB to the second output terminal 232 through the output transistor 277 that responds to the write signal WSTART. Accordingly, the negative voltage generation unit 270 may allow the precharge voltage VPRE used during the read operation to be reused during the write operation.

Hereinafter, the switch unit 230 of FIG. 1 will be described in detail.

Figure 5:
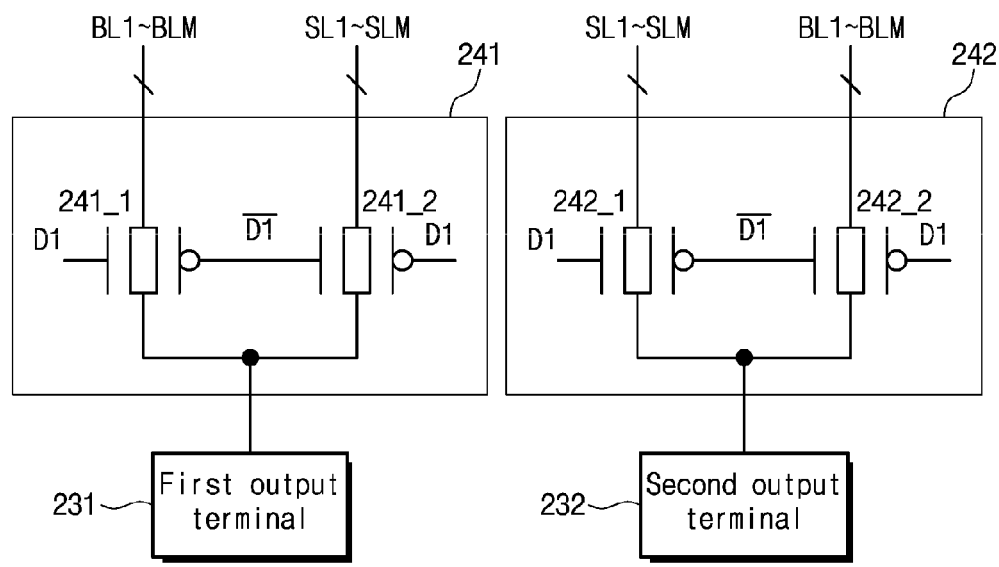
FIG. 5 is a circuit diagram showing a switch unit of FIG. 1.

FIG. 5 is a circuit diagram showing the switch unit 230 of FIG. 1.

Referring to FIGS. 1 and 5, the switch unit 230 may further include a first application switch 241 and a second application switch 242.

The first and second application switches 241 and 242 may switch-connect the first and second output terminals 231 and 232 to each other, which are connected to the pair of the bit line and the source line BL1 and SL1, BL2 and SL2, ... or BLM and SLM among the bit lines BL1 to BLM and the source lines SL1 to SLM in response to the input data D1.

In more detail, the first application switch 241 may switch-connect the first output terminal 231 connected to one of the bit line and the source line in the pair of the bit line and the source line BL1 and SL1, BL2 and SL2, ... or BLM and SLM to the other of the bit line and the source line in the pair of the bit line and the source line BL1 and SL1, BL2 and SL2, ... or BLM and SLM in response to the input data D1.

Simultaneously, the second application switch 242 may switch-connect the second output terminal 232 connected to the other of the bit line and the source line in the pair of the bit line and the source line BL1 and SL1, BL2 and SL2, ... or BLM and SLM to the one of the bit line and the source line in the pair of the bit line and the source line BL1 and SL1, BL2 and SL2, ... or BLM and SLM.

As an example, when the input data D1 is '0', the first application switch 241 may connect the first output terminal 231 connected to the bit line BL1, BL2, or BLM in the pair of the bit line and source line BL1 and SL1, BL2 and SL2, ... or BLM and SLM to the source line SL1, SL2, or SLM. In this case, the second application switch 242 may switch-connect the second output terminal 232 connected to the source line SL1, SL2, or SLM to the bit line BL1, BL2, or BLM in the pair of the bit line and the source line BL1 and SL1, BL2 and SL2, ... or BLM and SLM.

In more detail, the first application switch 241 may include a pair of first and second connection switches 241_1 and 241_2, when one of which is switched on in response to the input data D1 having a value of '0' or '1'm, the other is switched off. In this case, the first connection switch 241_1 may be located between the bit lines BL1 to BLM and the first output terminal 231, and the second connection switch 241_2, may be located between the source lines SL1 to SLM and the first output terminal 231.

In addition, the second application switch 242 may include a pair of third and fourth connection switches 242_1 and 242_2, when one of which is switched on in response to the input data D1 having the value of '0' or '1', the other is switched off. In this case, the third connection switch 242_1 may be located between the source lines SL1 to SLM and the second output terminal 232, and the fourth connection switch 242_2 may be located between the bit lines BL1 to BLM and the second output terminal 232.

That is, the switch unit 230 may switch the first output terminal 231 connected to the bit lines BL1 to BLM using the first application switch 241 in response to the input data D1 and may connect the first output terminal 231 to the source lines SL1 to SLM. In this case, the switch unit 230 may switch the second output terminal 232 connected to the source lines SL1 to SLM using the second application switch 242 in response to the input data D1 and may connect the second output terminal 232 to the bit lines BL1 to BLM. For instance, the switch unit 230 may switch the first output terminal 231 connected to the bit lines BL1 to BLM using the first application switch 241 when the input data D1 are '0' and may connect the first output terminal 231 to the source lines SL1 to SLM. Simultaneously, the switch unit 230 may switch the second output terminal 232 connected to the source lines SL1 to SLM using the second application switch 242 and may connect the second output terminal 232 to the bit lines BL1 to BLM.

According to the present exemplary embodiment, the switch unit 230 may be provided in plural number depending on the number of the sub-arrays 110_1 to 110_M. Therefore, the switch unit 230 may individually perform the switching operation on the pair of the bit line and the source line.

The switch unit 230 according to the exemplary embodiment of the present disclosure may switch-connect the bit lines BL1 to BLM and the source lines SL1 to SLM to the first and second output terminals 231 and 232 to each other in response to the input data D1. Thus, the switch unit 230 may switch and apply the drain voltage VDD and the negative voltage VBB to the bit lines BL1 to BLM and the source lines SL1 to SLM. That is, the switch unit 230 may reduce the write operation speed since the switch unit 230 may switch the voltages applied to the memory cell array 100 to each other in response to the input data D1.

Figure 6:
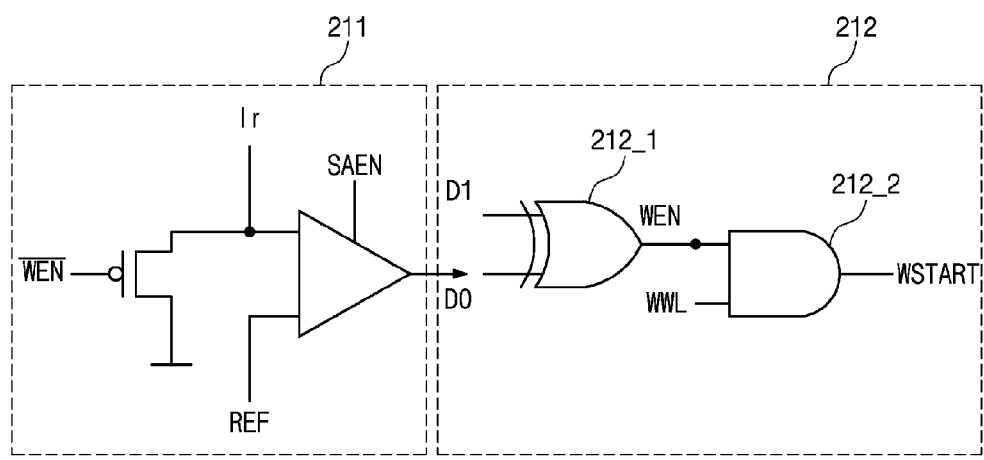
FIG. 6 is a circuit diagram showing a ling driving unit of FIG. 1.

FIG. 6 is a circuit diagram showing the ling driving unit 210 of FIG. 1.

Referring to FIGS. 1 and 6, the line driving unit 210 may further include a sense amplification unit 211 and a write signal generation unit 212.

In a case where the line driving unit 210 selects one read word line, e.g., RWL1, among the read word lines RWL1 to RWLN connected to the memory cell array 100, the sense amplification unit 211 may sense and amplify a current Ir flowing through one memory cell 10_1_1 connected to the read word line, e.g., RWL1.

That is, in the case where the one read word line, e.g., RWL1, is selected, the sense amplification unit 211 may sense and amplify the current Ir flowing to the first source line SL1 from the first bit line BL1, which is connected to the corresponding memory cell 10_1_1, through the MTJ 20. In this case, the sense amplification unit 211 may read the storage data D0 stored in the one memory cell 10_1_1 by comparing the current Ir with the reference current REF.

The write signal generation unit 212 may output the third enable signal WEN when the storage data D0 have a value different from that of the input data D1. In this case, when the line driving unit 210 selects one write word line, e.g., WWL1, among the write word lines WWL1 to WWLN connected to the memory cell array 100, the write signal generation unit 212 may generate the write signal WSTART. Meanwhile, the sense amplification unit 211 may stop the sensing and amplifying operations based on whether the third enable signal WEN generated when the storage data D0 are different from the input data D1 is presented.

In more detail, the write signal generation unit 212 may include an XOR gate 212_1 and an AND gate 212_2. The XOR gate 212_1 receives the storage data D0 read out by the sense amplification unit 211 and the input data D1 written into the memory cell 10_1_1 as its inputs and performs an XOR operation to output the third enable signal WEN. In addition, the AND gate 212_2 receives the third enable signal WEN and the selected first write word line WWL1 as its inputs to output the write signal WSTART.

Figure 7:
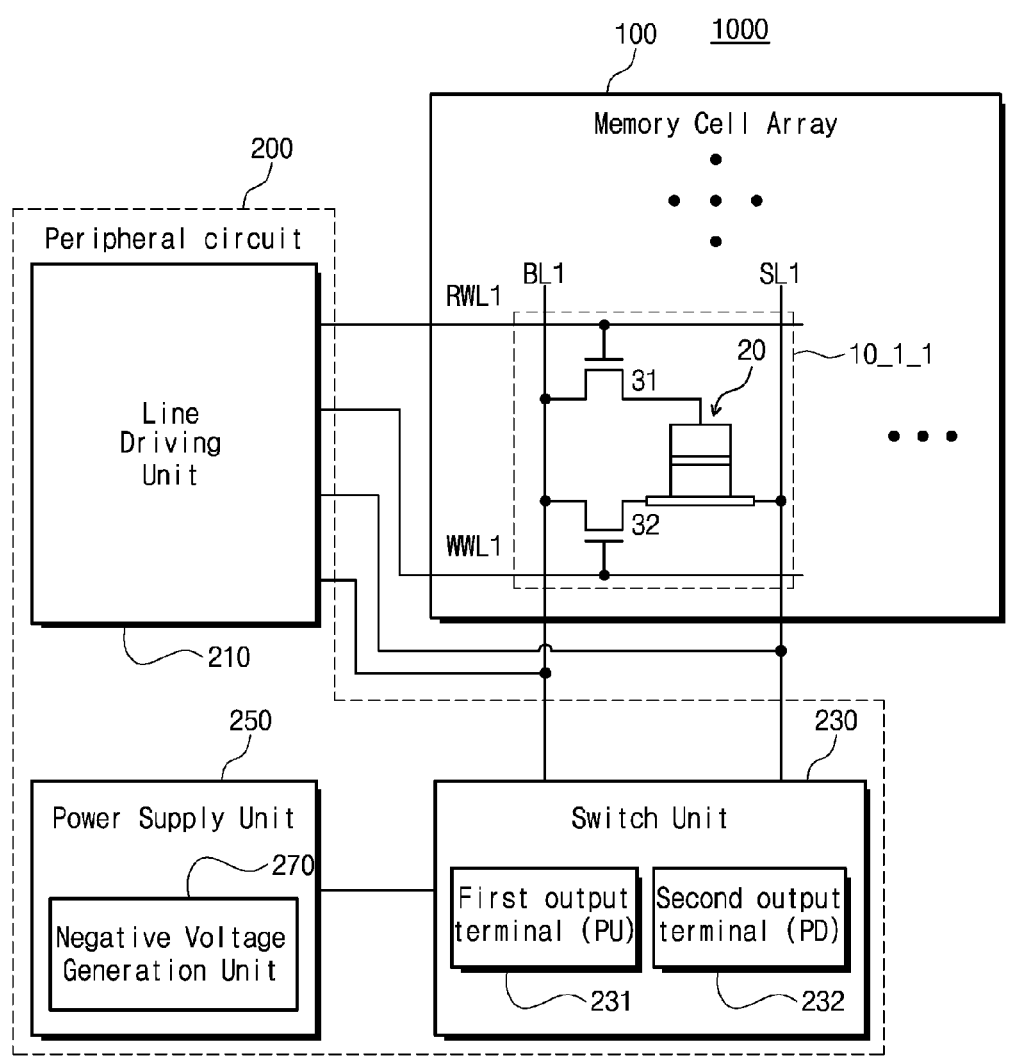
FIG. 7 is a block diagram illustrating a write operation of the semiconductor device of FIG. 1.
Figure 8:
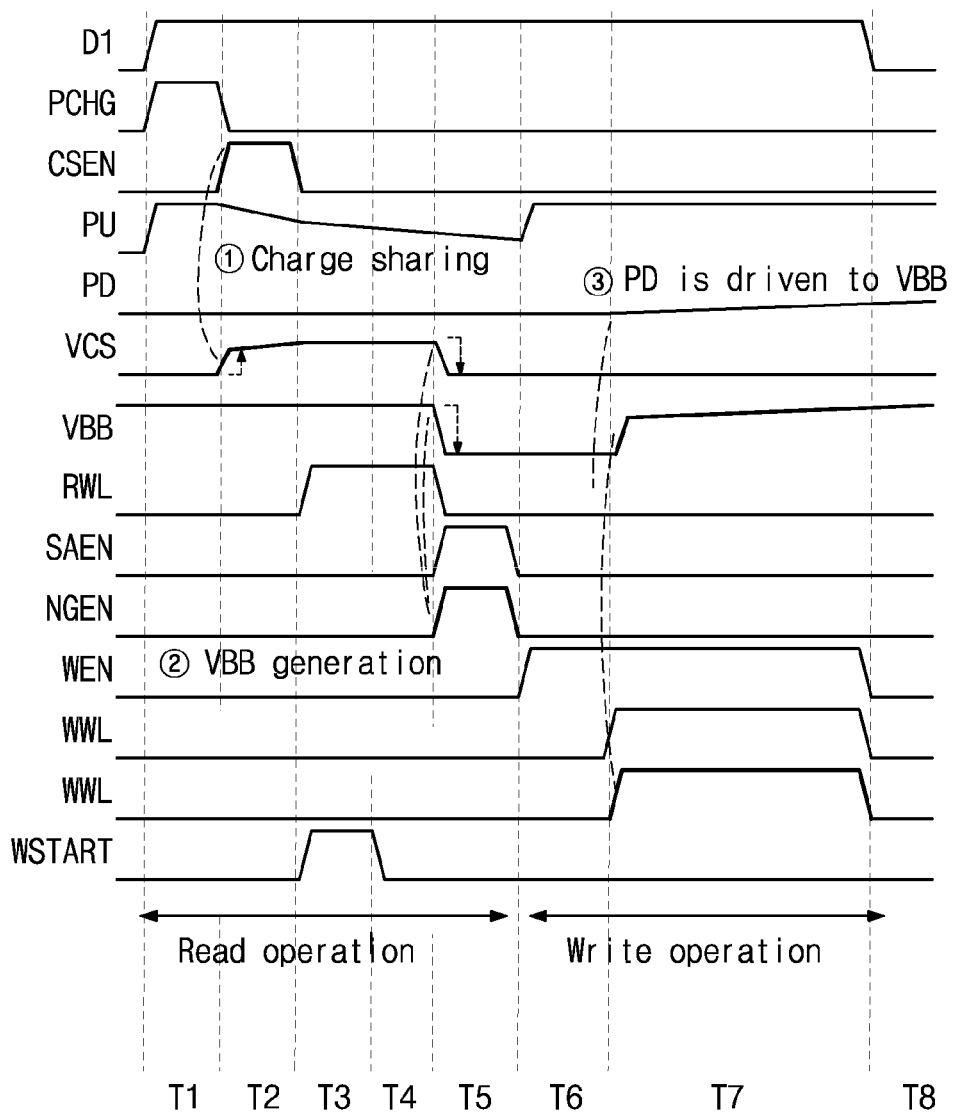
FIG. 8 is a timing diagram illustrating the write operation of the semiconductor device of FIG. 7.

FIG. 7 is a block diagram illustrating the write operation of the semiconductor device 1000 of FIG. 1, and FIG. 8 is a timing diagram illustrating the write operation of the semiconductor device 1000 of FIG. 7.

Referring to FIGS. 1 to 8, the semiconductor device 1000 may perform the read operation on the storage data D0 stored in the memory cell 10_1_1 to write the input data D1 into the memory cell 10_1_1.

Accordingly, the line driving unit 210 may read the storage data D0 stored in the memory cell 10_1_1 in T1 to T5 sections before the input data D1 are written into the memory cell 10_1_1.

In the T1 section, the line driving unit 210 may transmit the precharge signal PCHGEN to the power supply unit 250. That is, in the T1 section, the power supply unit 250 may output the precharge voltage VPRE and the source voltage VSS to the first output terminal 231 and the second output terminal 232, respectively, in response to the precharge signal PCHGEN provided from the line driving unit 210.

Then, in the T2 section, the line driving unit 210 may generate the first enable signal CSEN and may transmit the first enable signal CSEN to the charge-share switch 271. In this case, in the T2 section, the charge-share switch 271 may charge-share the precharge voltage VPRE output to the first output terminal 231 with the charge capacitor 272 in response to the first enable signal CSEN and may charge the first voltage VCS in the charge capacitor 272 depending on the capacitance of the charge capacitor 272. Thus, in the T2 section, a voltage PU of the first output terminal 231 may be changed in a decreasing direction due to the charge share operation, and the first voltage VCS may be changed in an increasing direction to the capacitance.

During the T3 and T4 sections, the line driving unit 210 may select the first read word line RWL1 that is to be read. In this case, since the line driving unit 210 senses and amplifies the current flowing from the first bit line BL1 to the first source line SL1 through the MTJ 20 and dissipates the voltage PU of the first output terminal 231 during the T3 to T5 sections, the voltage PU of the first output terminal 231 may be changed in the decreasing direction.

According to the exemplary embodiment, in the T3 section, the line driving unit 210 may generate the erase signal INIT and may transmit the erase signal INIT to the third discharge transistor 278 when selecting the first read word line RWL1 of the memory cell 10_1_1 that is to be read. In this case, the third discharge transistor 278 may discharge the negative voltage VBB previously generated to the common ground through the second node 276 in response to the erase signal INIT.

Then, in the T5 section, the line driving unit 210 may sense and amplify (SAEN) the current flowing to the first source line SL1 from the first bit line BL1 through the MTJ 20 and, substantially simultaneously, may generate the second enable signal NGEN to transmit the second enable signal NGEN to the first and second discharge transistors 274 and 275. In this case, in the T5 section, the first discharge transistor 274 may discharge the first voltage VCS charged in the charge capacitor 272 to the common ground through the first node 273 located at the one side of the charge capacitor 272 in response to the second enable signal NGEN.

Accordingly, in the T5 section, since the first voltage VCS is discharged through the first node 273, the negative voltage generation unit 270 may generate the negative voltage VBB on the second node 276. That is, the first voltage VCS begins to be changed in the decreasing direction at a start point of the T5 section, and substantially simultaneously, the negative voltage VBB may be changed in a negative (−) axis direction on a horizontal axis corresponding to the source voltage VSS.

In a T6 section, the line driving unit 210 may generate the third enable signal WEN based on the difference between the storage data D0 of the memory cell 10_1_1, which are sensed, amplified, and read, and the input data D1 that are to be written into the memory cell 10_1_1. In addition, in the T6 section, the line driving unit 210 may transmit the third enable signal WEN to the power supply unit 250. In this case, in the T6 and 67 sections, the power supply unit 250 may output the drain voltage VDD required for the write operation to the first output terminal 231 in response to the third enable signal WEN. Therefore, during the T3 to T5 sections, the voltage PU of the first output terminal 231 may be changed in the decreasing direction from the precharge voltage VPRE, and in the T6 section, the voltage PU of the first output terminal 231 may be changed in the increasing direction to the drain voltage VDD.

In a T7 section, when the power supply unit 250 outputs the drain voltage VDD to the first output terminal 231, the line driving unit 210 may select the first write word line WWL1. In the T7 section, as the first write word line WWL1 is selected, the line driving unit 210 may generate the write signal WSTART and may transmit the write signal WSTART to the output transistor 277. Therefore, in the T7 section, the output transistor 277 may output the negative voltage VBB generated at the second node 276 to the second output terminal 232 and may write the input data D1 into the memory cell 10_1_1. That is, in the T7 section, a voltage PD of the second output terminal 232 may be changed in the increasing direction by the negative voltage VBB, and the negative voltage VBB may be changed in a consuming direction, i.e., in the increasing direction to the source voltage VSS of about 0 volts.

Figure 9:
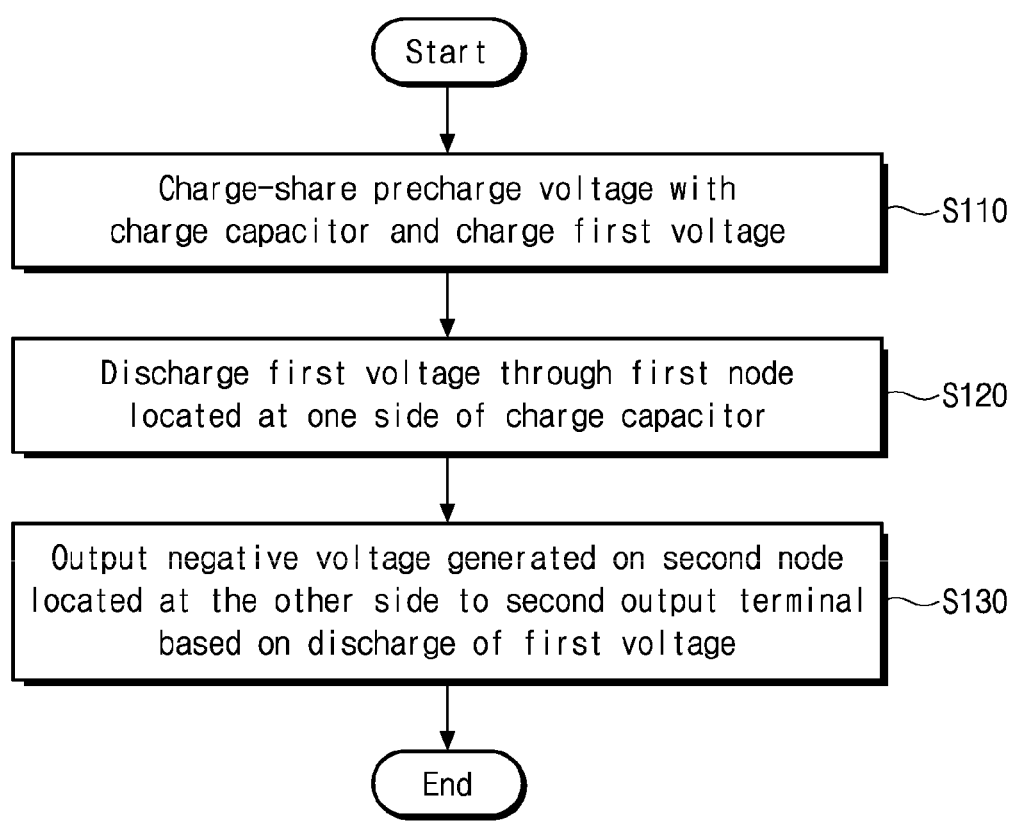
FIG. 9 is a flowchart illustrating a reuse of a precharge voltage according to the write operation of the semiconductor device of FIG. 7.

FIG. 9 is a flowchart illustrating the reuse of the precharge voltage VPRE according to the write operation of the semiconductor device 1000 of FIG. 7.

Referring to FIGS. 1 to 9, in operation S110, the negative voltage generation unit 270 may charge-share the precharge voltage VPRE, which is output to the first output terminal 231 from the power supply unit 250, with the charge capacitor 272 to be charged with the first voltage VCS depending on the capacitance of the charge capacitor 272.

In operation S120, the negative voltage generation unit 270 may discharge the first voltage VCS charged in the charge capacitor 272 to the common ground through the first node 273 located at the one side of the charge capacitor 272.

In operation S130, the negative voltage generation unit 270 may output the negative voltage VBB generated at the second node located at the other side of the charge capacitor 272 to the second terminal 232 based on the discharge of the first voltage VCS of the charge capacitor 272.

Figure 10:
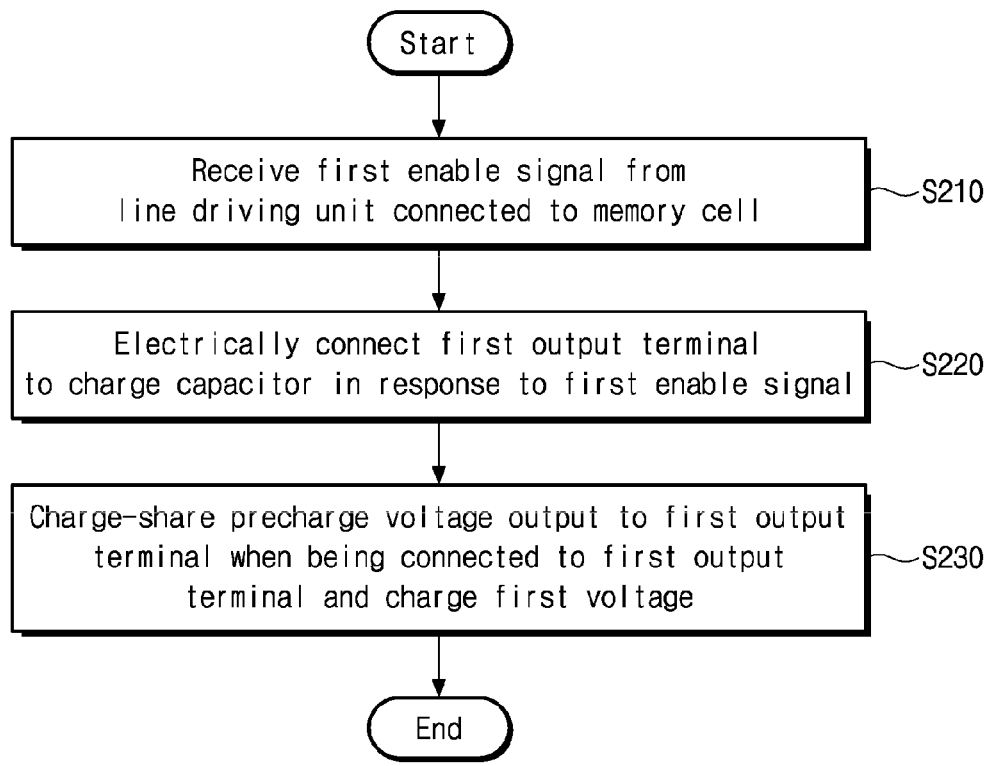
FIG. 10 is a flowchart illustrating a charge operation of FIG. 9.

FIG. 10 is a flowchart illustrating the charge operation of FIG. 9.

Referring to FIGS. 1 to 10, in operation S210, the charge-share switch 271 may receive the first enable signal CSEN from the line driving unit 210 connected to the memory cell 10_1_1.

In operation S220, the charge-share switch 271 may electrically connect the first output terminal 231 to the charge capacitor 272 in response to the first enable signal CSEN.

In operation S230, the charge capacitor 272 may charge-share the precharge voltage VPRE output to the first output terminal 231 when being connected to the first output terminal 231 and may be charged with the first voltage VCS depending on the capacitance.

Figure 11:
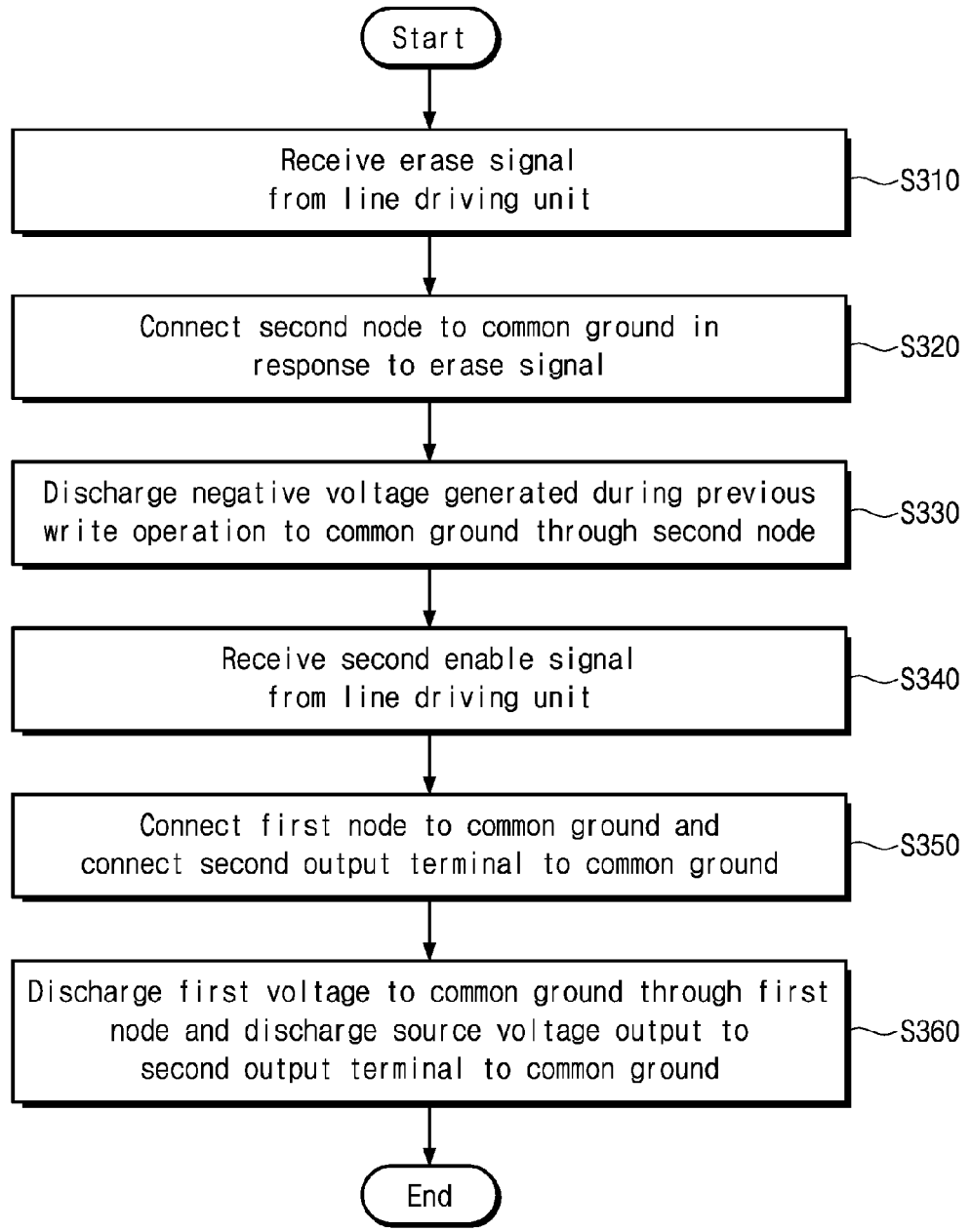
FIG. 11 is a flowchart illustrating a discharge operation of FIG. 9.

FIG. 11 is a flowchart illustrating the discharge operation of FIG. 9.

Referring to FIGS. 1 to 9 and 11, in operation 310, when the line driving unit 210 selects the first read word line RWL1, the third discharge transistor 278 may receive the erase signal INIT from the line driving unit 210.

In this case, in operation S320, the third discharge transistor 278 may connect the second node 276 to the common ground in response to the erase signal INIT, and in operation S330, the third discharge transistor 278 may discharge the negative voltage VBB generated during the previous write operation to the common ground through the second node 276.

In operation S340, the first and second discharge transistors 274 and 275 may receive the second enable signal NGEN from the line driving unit 210.

In operation S350, responsive to the second enable signal NGEN, the first and second discharge transistors 274 and 275 may connect the first node 273 to the common ground and may connect the second output terminal 232 to the common ground.

In operation S360, the first and second discharge transistors 274 and 275 may discharge the first voltage VCS to the common ground through the first node 273 and may discharge the source voltage VSS output to the second output terminal 232 to the common ground.

Figure 12:
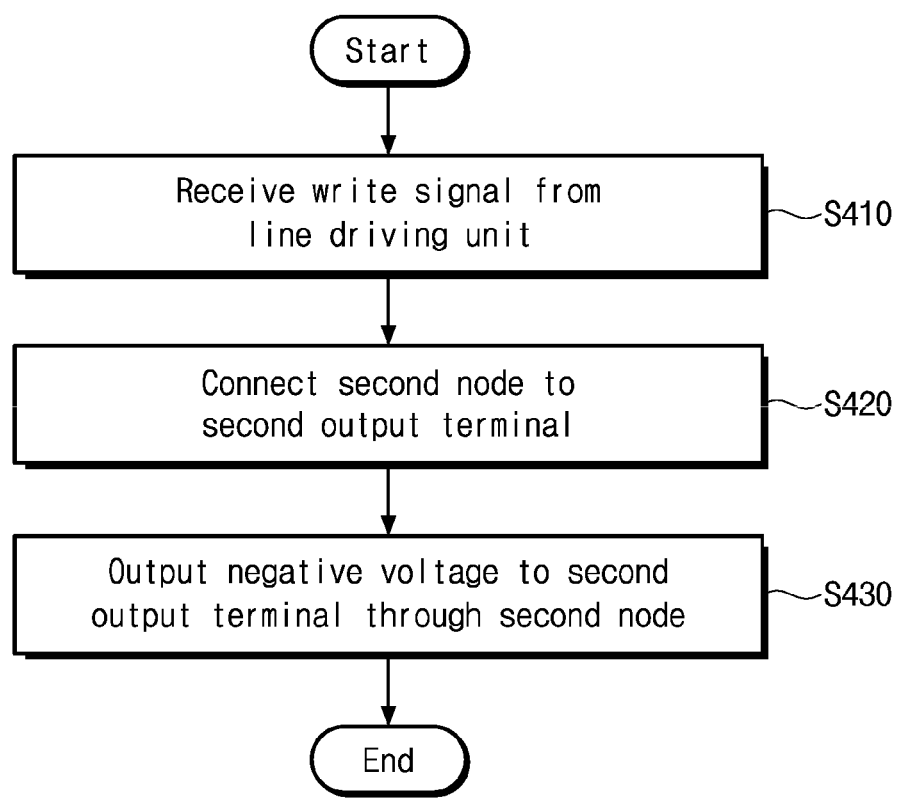
FIG. 12 is a flowchart illustrating an output operation of FIG. 9.

FIG. 12 is a flowchart illustrating the output operation of FIG. 9.

Referring to FIGS. 1 to 9 and 12, in operation S410, the output transistor 277 may receive the write signal WSTART from the line driving unit 210.

In operation S420, the output transistor 277 may connect the second node 276 to the second output terminal 232 in response to the write signal WSTART.

In operation S430, the output transistor 277 may output the negative voltage VBB generated in operation S130 to the second output terminal 232 through the second node 276 based on the discharge of the first voltage VCS.

Figure 13:
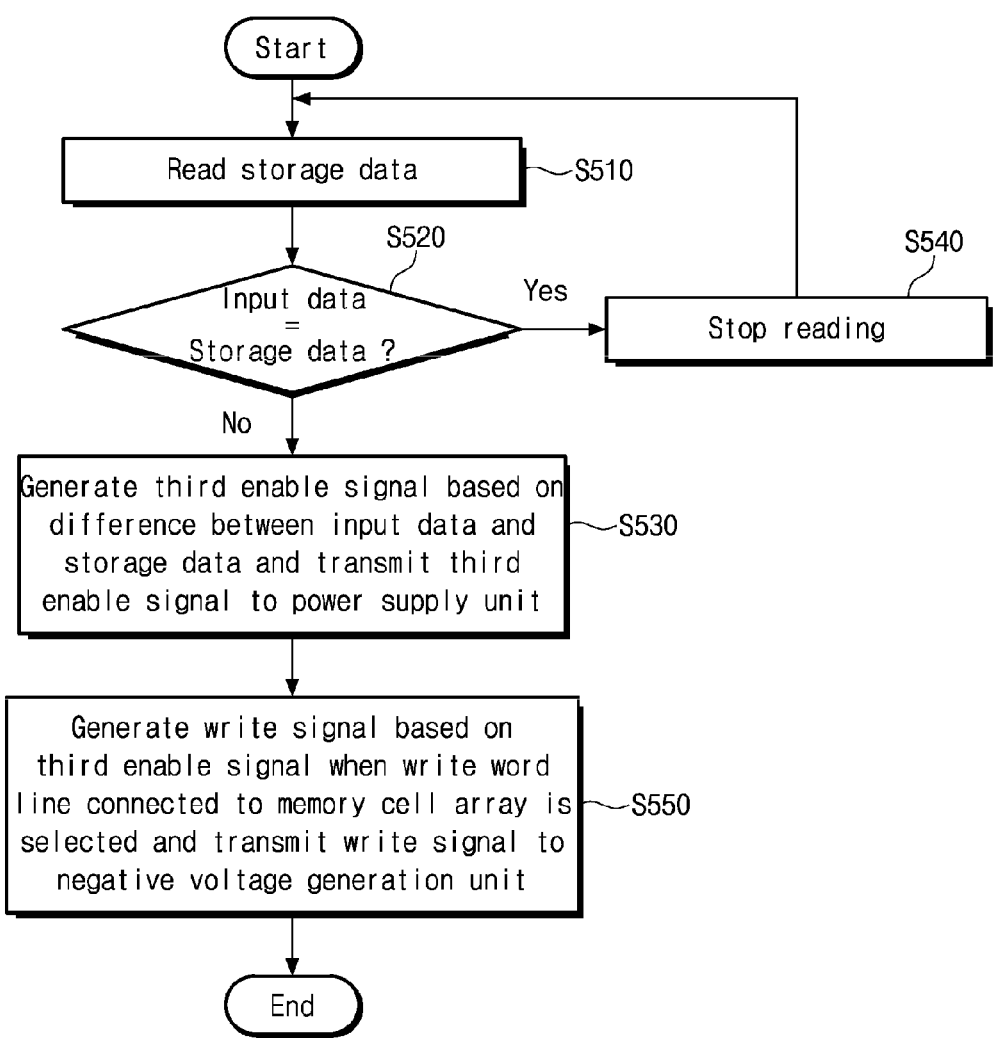
FIG. 13 is a flowchart illustrating a generation operation of the line driving unit of FIG. 7.

FIG. 13 is a flowchart illustrating the generation operation of the write signal WSTART by the line driving unit of FIG. 7.

Referring to FIGS. 1 to 8 and 10, in operation S510, the line driving unit 210 may sense and amplify the current flowing to the first source line SL1 from the first bit line BL1 through the MTJ 20 and may compare the sensed and amplified current with the reference current to read out the storage data D0.

In operation S520, the line driving unit 210 may determine whether there is a difference between the input data D1 input to the memory cell 10_1_1 and the read-out storage data D0.

In operation 530, the line driving unit 210 may generate the third enable signal WEN according to the difference between the input data D1 input to the memory cell 10_1_1 and the storage data D0 and may transmit the third enable signal WEN to the power supply unit 250.

In operation S530, the power supply unit 250 may receive the third enable signal WEN generated by the line driving unit 210, may convert the precharge voltage VPRE, which is reduced due to the charge operation at the first output terminal 231, to the drain voltage VDD in response to the third enable signal WEN, and may output the drain voltage VDD to the first output terminal 231.

Meanwhile, in operation S540, the line driving unit 210 may stop reading the storage data D0 when the input data D1 and the storage data D0 are the same as each other.

In operation S550, the line driving unit 210 may generate the write signal WSTART and may transmit the write signal WSTART to the negative voltage generation unit 270 when the line driving unit 210 selects the first write word line WWL1 connected to the memory cell 10_1_1.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A semiconductor device comprising:
a line driving unit connected to a memory cell array;
a switch unit comprising first and second output terminals electrically connected to the memory cell array through a plurality of bit lines and a plurality of source lines; and
a power supply unit outputting a precharge voltage and a source voltage to the first and second output terminals, wherein the power supply unit comprises a negative voltage generation unit that charge-shares the precharge voltage to be charged with a first voltage and discharges the first voltage to one side to generate a negative voltage on the other side.

2. The semiconductor device of claim 1, wherein the switch unit switch-connects a pair of the bit line and the source line among the bit lines and the source lines and the first and second output terminals to each other in response to input data.

3. The semiconductor device of claim 1, wherein the power supply unit outputs the negative voltage to the second output terminal when a drain voltage is output to the first output terminal.

4. The semiconductor device of claim 1, wherein the negative voltage generation unit comprises:
a charge-share switch connected to the first output terminal;
a charge capacitor connected to the first output terminal through the charge-share switch;
first and second discharge transistors respectively connected to a first node located at the one side and the second output terminal; and
an output transistor connected between a second node located at the other side and the second output terminal.

5. The semiconductor device of claim 4, wherein the charge-share switch charge-shares the precharge voltage output to the first output terminal with the charge capacitor in response to a first enable signal provided from the line driving unit.

6. The semiconductor device of claim 4, wherein the first discharge transistor discharges the first voltage to a common ground through the first node in response to a second enable signal provided from the line driving unit.

7. The semiconductor device of claim 6, wherein the second discharge transistor discharges the source voltage output to the second output terminal to the common ground in response to the second enable signal provided from the line driving unit.

8. The semiconductor device of claim 4, further comprising a third discharge transistor connected to the second node, wherein the third discharge transistor discharges a negative voltage generated during a previous write operation to a common ground through the second node in response to an erase signal provided from the line driving unit.

9. The semiconductor device of claim 2, wherein the switch unit further comprises:
 a first application switch switch-connecting the first output terminal connected to one of the bit line and the source line in the pair of the bit line and the source line to the other of the bit line and the source line in the pair of the bit line and the source line in response to the input data; and
 a second application switch switch-connecting the second output terminal to the one of the bit line and the source line.

10. The semiconductor device of claim 9, wherein the memory cell array comprises a memory cell comprising a magnetic tunneling junction (MTJ) disposed between the pair of the bit line and the source line, and the memory cell comprises a read word line and a write word line, which are respectively connected to gates of first and second transistors that connect the magnetic tunneling junction to the read and write word lines.

11. The semiconductor device of claim 10, wherein the line driving unit selects the read word line, senses a current flowing to a corresponding source line from the bit line through the magnetic tunneling junction, amplifies the sensed current, and reads storage data stored in the memory cell.

12. The semiconductor device of claim 11, wherein the line driving unit generates a write signal according to a difference between the storage data and the input data after selecting the write word line.

13. The semiconductor device of claim 12, wherein the negative voltage generation unit outputs the negative voltage to the second output terminal in response to the write signal.

14. A method for writing data of a semiconductor device, comprising:
 allowing a negative voltage generation unit to charge-share a precharge voltage output to a first output terminal from a power supply unit and a charge capacitor to be charged with a first voltage based on the precharge voltage;
 allowing the negative voltage generation unit to discharge the first voltage through a first node located at one side of the charge capacitor; and
 allowing the negative voltage generation unit to output a negative voltage generated on a second node located at the other side of the charge capacitor to a second output terminal based on the discharge of the first voltage.

15. The method of claim 14, wherein the charging comprises allowing the negative voltage generation unit to connect the first output terminal to the charge capacitor in response to a first enable signal provided from a line driving unit.

16. The method of claim 15, wherein the discharging comprises allowing the negative voltage generation unit to connect the second node to a common ground in response to an erase signal provided from the line driving unit.

17. The method of claim 15, wherein the discharging comprises allowing the negative voltage generation unit to connect the first node to a common ground in response to a second enable signal provided from the line driving unit.

18. The method of claim 17, wherein the discharging comprises allowing the negative voltage generation unit to connect the second node to the second output terminal in response to the second enable signal.

19. The method of claim 14, further comprising allowing first and second application switches of the semiconductor device, which are connected to the first and second output terminals, to switch-connect the first and second output terminals connected to a pair of a bit line and a source line among a plurality of bit lines and a plurality of source lines to each other in response to input data applied thereto.

20. The method of claim 15, wherein the outputting comprises allowing the line driving unit to generate a third enable signal based on a difference between storage data stored in a memory cell and input data that are to be written;
 allowing the line driving unit to generate a write signal based on whether the third enable signal is generated when a write word line connected to the memory cell is selected; and
 allowing the negative voltage generation unit to connect the second node to the second output terminal in response to the write signal provided from the line driving unit.

* * * * *